(12) United States Patent
Ikuta et al.

(10) Patent No.: US 8,304,858 B2
(45) Date of Patent: *Nov. 6, 2012

(54) LATERAL INSULATED GATE BIPOLAR TRANSISTOR HAVING A RETROGRADE DOPING PROFILE IN BASE REGION AND METHOD OF MANUFACTURE THEREOF

(75) Inventors: Teruhisa Ikuta, Nara (JP); Yoshinobu Sato, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/064,430

(22) Filed: Mar. 24, 2011

(65) Prior Publication Data

US 2011/0169046 A1 Jul. 14, 2011

Related U.S. Application Data

(60) Continuation of application No. 12/662,680, filed on Apr. 28, 2010, now Pat. No. 7,944,022, which is a division of application No. 11/943,614, filed on Nov. 21, 2007, now Pat. No. 7,719,086.

(30) Foreign Application Priority Data

Dec. 11, 2006 (JP) .................................. 2006-332718

(51) Int. Cl.
*H01L 29/93* (2006.01)
(52) U.S. Cl. ........ 257/556; 257/517; 257/525; 257/557; 257/575; 257/E51.004

(58) Field of Classification Search .................. 257/517, 257/525, 556, 557, 575, E51.004
See application file for complete search history.

(56) References Cited

U.S. PATENT DOCUMENTS

| 5,801,420 A | 9/1998 | Fujishima |
| 6,066,863 A | 5/2000 | Fujishima |
| 7,719,086 B2 * | 5/2010 | Ikuta et al. ........... 257/556 |
| 7,944,022 B2 * | 5/2011 | Ikuta et al. ........... 257/556 |
| 2002/0125542 A1 | 9/2002 | Suzuki et al. |
| 2006/0118902 A1 | 6/2006 | Ikuta et al. |
| 2010/0213509 A1 | 8/2010 | Ikuta et al. |

FOREIGN PATENT DOCUMENTS

| JP | 8-130312 | 5/1996 |
| JP | 10-242456 A | 9/1998 |
| JP | 2002-270844 A | 9/2002 |
| JP | 2006-165145 | 6/2006 |

* cited by examiner

*Primary Examiner* — Tan N Tran
(74) *Attorney, Agent, or Firm* — Panasonic Patent Center

(57) ABSTRACT

In a semiconductor device of the present invention, a first base region 16 is extended to a part under a gate electrode 7 while having a vertical concentration profile of an impurity that increases from the surface of a semiconductor layer 3 and becomes maximum under an emitter region 5, and the length in the lateral direction from a point where the impurity concentration becomes maximum located under an end of the gate electrode 7 to the boundary with a second base region 15 is not smaller than the length in the vertical direction from the point where the impurity concentration becomes maximum to the boundary with the second base region 15.

5 Claims, 13 Drawing Sheets

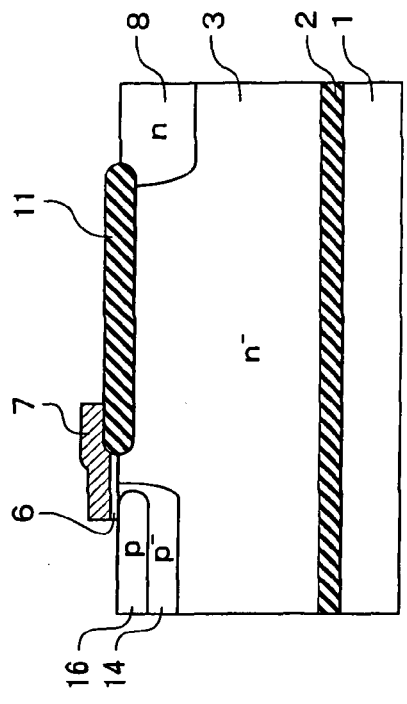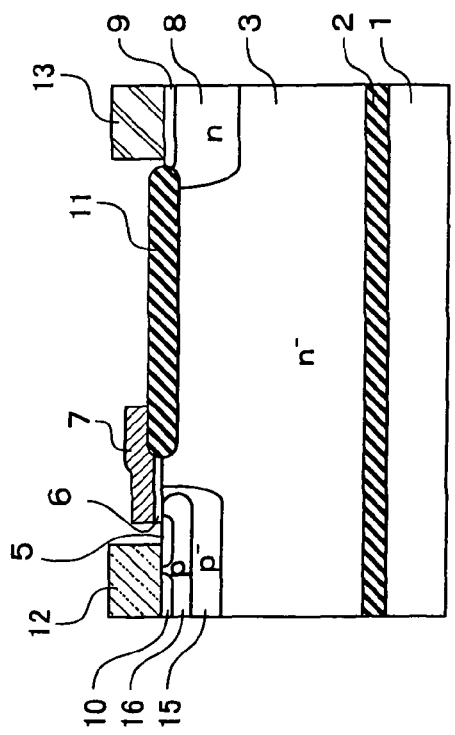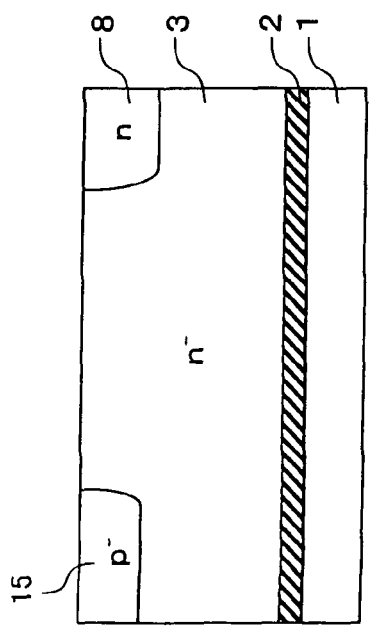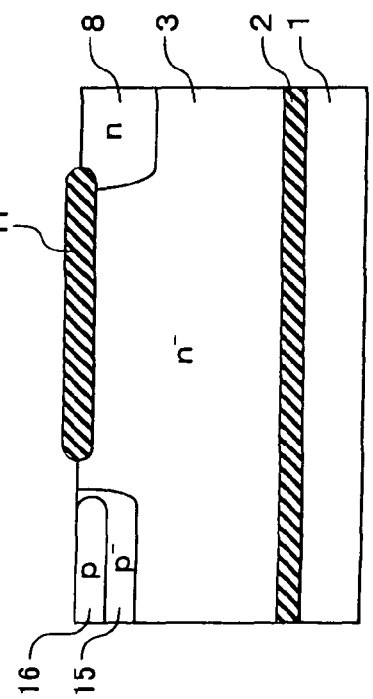

LATERAL INSULATED GATE BIPOLAR TRANSISTOR HAVING A RETROGRADE DOPING PROFILE IN BASE REGION AND METHOD OF MANUFACTURE THEREOF

CROSS REFERENCE TO RELATED APPLICATIONS

This application is a continuation of U.S. patent application Ser. No. 12/662,680, filed Apr. 10, 2010, which is a divisional of application Ser. No. 11/943,614, filed Nov. 21, 2007, now U.S. Pat. No. 7,719,086, issued May 18, 2010, which claims the priority of Japanese Patent Application No. 2006-332718, filed Dec. 11, 2006. U.S. patent application Ser. No. 12/965,665, filed Dec. 9, 2010, is also a continuation of application Ser. No. 12/662,680.

FIELD OF THE INVENTION

The present invention mainly relates to an insulated gate bipolar transistor (hereafter abbreviated as "IGBT").

BACKGROUND OF THE INVENTION

With a marked price reduction of color plasma display panels (hereafter abbreviated as "PDP") in recent years, the cost reduction of incorporated semiconductor products has been demanded. For a scan drivers IC for color PDPs, an integrated circuit wherein high voltage lateral IGBTs and low voltage circuits are integrated in a chip are often adopted on a SOI (silicon on insulator) substrate.

In order to reduce the costs of the above-described IC, it is effective to reduce the size of the lateral IGBT that occupies a large area in a chip. For this reason, the current capability of the lateral IGBT at forward bias must be improved. The current capability of the lateral IGBT is measured on at least on-state voltage and characteristics of destroying devices, such as SOA (safe operating area) and ESD (electrostatic discharge).

FIG. 9 shows a general lateral IGBT on a SOI substrate. An N-type semiconductor layer 3 is bonded on a supporting substrate 1 via a buried insulating film 2. On the surface of the N-type semiconductor layer 3, a P-type base region 4 and an N-type buffer region 8 are formed. On the surface of the P-type base region 4, an N$^+$-type emitter region 5 and a P$^+$-type base contact diffusion region 10 are diffused. On the surface of the N-type buffer region 8, a P$^+$-type collector region 9 is diffused. On the P-type base region 4, a gate electrode 7 extends above a field oxide film 11 via a gate insulating film 6. On the N$^+$-type emitter region 5 and the P$^+$-type base contact diffusion region 10, an emitter electrode 12 is formed, and on the P$^+$-type collector region 9, a collector electrode 13 is formed.

The factors that determine on-state voltage and SOA will be described.

On-state voltage chiefly depends on the resistance component when the device is in the on-state. The channel resistance formed below the gate insulating film 6 is one of major resistance components, and the reduction thereof is important. Whereas, the control of latch up is important for SOA.

As shown in FIG. 10, since a parasitic NPN transistor composed of the N$^+$-type emitter region 5, the P-type base region 4, and the N-type semiconductor layer 3 is present, the equivalent circuit of the lateral IGBT has a thyristor structure as shown in FIG. 11. Once this thyristor causes latch-up, the thyristor cannot be controlled by gate voltage and a low-impedance state is produced bringing in breakdown. The condition of generating latch up is:

$$\alpha_{(NPN)} + \alpha_{(PNP)} \leq 1$$

where $\alpha_{(NPN)}$ and $\alpha_{(PNP)}$ are the common base current gains of the parasitic NPN transistor and PNP transistor, respectively. Thereby, to control latch-up, it is also important to lower the current gain α of both bipolar transistors.

Since the PNP transistor relates to on-state voltage, the excessive lowering of the current gain α reduces priority to the MOS transistor. Therefore, to prevent latch-up, the action of the parasitic NPN transistor (turn-on) is suppressed. The common base current gain α of the parasitic NPN bipolar transistor is given by the following formula:

$$\alpha = [1 - (D_E/D_P)(N_B/N_E)(W/L_E)] \cdot [1 - W^2/2L_B^2]$$

where $D_E$ is the diffusion coefficient of minority carriers in the emitter region, $D_P$ is the diffusion coefficient of minority carriers in the base region, $N_B$ is the impurity concentration in the base region, $N_E$ is the impurity concentration in the emitter region, W is the width of the base region, $L_E$ is the diffusion length of minority carriers in the emitter region, and $L_B$ is the diffusion length of minority carriers in the base region. In order to lower α value obviously, it is effective to increase $N_B$, reduce $N_E$, and increase W.

To suppress the turn-on of the parasitic NPN transistor, it is effective to reduce the base resistance Rb below the emitter region. When the lateral IGBT is in the on state and the collector current is increased, the voltage drop increases in the base resistance Rb. When the voltage drop exceeds the built-in potential $V_{bi}$, turn-on is started. Therefore, the reduction of the base resistance Rb is particularly important.

Normally in the device structure of a lateral IGBT, as shown in FIG. 9, a P$^+$-type base contact diffusion region 10 of a high concentration is inserted under the N$^+$-type emitter region 5. Alternatively, a dedicated high-concentration diffusion layer having larger diffusion depth may be diffused from the surface instead of the P$^+$-type base contact diffusion region 10. In any case of the P$^+$-type base contact diffusion region 10 and the dedicated high-concentration diffusion layer, since channel resistance is increased when diffusion reaches under the gate electrode 7, a sufficient margin is required in the distance L1 to the gate electrode 7 shown in FIG. 10. The base resistance becomes the serial resistance of the distance L1 of a low concentration and the distance L2 of a high concentration.

Therefore, the turn-on of the parasitic NPN transistor depends on the voltage drop in the distance L1 having a higher resistance. The distance L1 is easily varied by the widths of the gate electrode 7 and the P$^+$-type base contact diffusion region 10, and their misalignment. In addition, the lateral spread of diffusion is easily influenced by variation of heat treatment (drive-in temperature and time) then it's variation changes the distance L1.

To reduce such variation factors, a device structure wherein a high-concentration region is formed in the entire area under the emitter region has been proposed.

In the invention described in Japanese Patent Application Laid-Open No. 10-242456, as shown in FIG. 12, a high-concentration P-type region 14 is continuously added under a P-type base region 4. In the invention described in Japanese Patent Application Laid-Open No. 2002-270844, as shown in FIG. 13, a high-concentration P-type region 14 is formed under an emitter region 5. The high-concentration P-type region 14 is formed by self-aligning to the gate electrode 7 so as not to affect the channel portion.

In both of the above-described conventional techniques, since on-state voltage depends on the channel resistance of the P-type base region 4, and latch-up depends on the high-concentration P-type region 14. Thereby, the on-state voltage and the latch-up can be independently controlled. Furthermore, since the high-concentration P-type region 14 does not reach the channel region, the variation of channel resistance can be reduced.

DISCLOSURE OF THE INVENTION

Problems in the device structure of conventional techniques will be described below.

As described above, it is desirable to lower the current gain α of the parasitic NPN transistor for preventing latch up. When the state of the parasitic NPN transistor is turn-on, the base potential at the end of the emitter region is increased. Then, minority carriers (electrons) are diffused from the end of the emitter region toward the P-type base region. Since the high-concentration P-type region is present under the emitter region, current gain lowers. On the other hand, since the low-concentration P-type base region is present under the gate electrode, current gain from the emitter region in the lateral direction is higher than current gain in the vertical direction. Consequently, carriers are diffused mainly into the low-concentration region in the lateral direction and arrive at the N-type semiconductor layer.

Therefore, to suppress current gain, the concentration of a P-type impurity is increased in the P-type base region under the gate electrode located in the lateral direction near the emitter end, and alternatively, the width of the P-type base region is expanded in the lateral direction.

However, to avoid the expansion of the width in the lateral direction of the element, the width of the P-type base region under the gate electrode would rather be reduced as much as possible. For the P-type base region, all of the above-described conventional techniques have normal diffusion profiles, specifically Gaussian distribution wherein the surface concentration is highest. Therefore, if the entire impurity concentration is increased, the surface concentration is also increased. The increase of the surface concentration not only results in the increase of channel resistance, but also increases emitter resistance because the low concentration of N-type impurity in the emitter region under the sidewalls of the gate electrode might be affected. Therefore, the impurity concentration in the P-type base region cannot be set to be high. Consequently, it is difficult to reduce the width of the P-type base region under the gate electrode.

What is described above is more important in a high breakdown voltage element having a breakdown voltage of about 200 V used in a PDP scan driver IC. This is because when a high voltage is supplied between the emitter and the collector, the depletion region spreads toward the P-type base region side, and the base width is narrowed.

In the invention described in Japanese Patent Application Laid-Open No. 2002-270844, as shown in FIG. 13, a high-concentration P-type region 14 is present only under the emitter region 5, and a low-concentration P-type region is present under the gate electrode 7.

In the invention described in Japanese Patent Application Laid-Open No. 10-242456, as shown in FIG. 12, although a high-concentration P-type region 14 extends to under the gate electrode 7, it does not reach the surface, and a low-concentration P-type base region is present in the lateral direction from the side of the emitter region 5, which is not sufficient.

Furthermore, another problem in the conventional technique will be described.

In the invention described in Japanese Patent Application Laid-Open No. 10-242456, since the high-concentration P-type region 14 is present under the P-type base region 4, the curvature of the PN junction to the N-type semiconductor layer 3 increases electric fields easily. Therefore, it is not so preferable as a device having high breakdown voltage of 100 V and above.

In the invention described in Japanese Patent Application Laid-Open No. 2002-270844, since the high-concentration P-type region 4 is formed by self-alignment with the gate electrode 7, if the accelerating energy and the dose of the P-type impurity (boron) are increased, the P-type impurity penetrates through the gate electrode 7, and affects the channel. Therefore, the thickness reduction of the polysilicon gate electrode is difficult. At present, with a fine process rule, since the polysilicon film tends to be thinned for relieving steps, and the existing process cannot be used as it is, there is a disadvantage that process changes are required and lower developing efficiency is lowered.

A semiconductor device according to an embodiment of the present invention includes a supporting substrate; a semiconductor layer of a first conductivity type formed above a main surface of the supporting substrate via a buried insulating film; a first base region of a second conductivity type formed from the surface of the semiconductor layer; a second base region of the second conductivity type having a concentration lower than the surface concentration of the first base region, and including the first base region fully or partly; a buffer region of the first conductivity type formed from the surface of the semiconductor layer apart from the second base region in the lateral direction; an emitter region of the first conductivity type formed from the surface of the first base region; a collector region of the second conductivity type formed from the surface of the buffer region; a base contact diffusion region of the second conductivity type formed from the surface of the first base region or the second base region; a gate insulating film formed on the second base region at least from an end of the emitter region to an end of the second base region; a gate electrode formed on the gate insulating film; an emitter electrode connected on the emitter region and the base contact diffusion region; and a collector electrode connected on the collector region; wherein the first base region is extended to a part under the gate electrode while having a vertical concentration profile of an impurity of the second conductivity type that increases from the surface of the semiconductor layer and becomes maximum under the emitter region; and the length in the lateral direction from a point where the impurity concentration becomes maximum located under an end of the gate electrode to the boundary with the second base region is not smaller than the length in the vertical direction from the point where the impurity concentration becomes maximum to the boundary with the second base region.

A semiconductor device according to another embodiment of the present invention includes a supporting substrate; a second base region composed of a semiconductor layer of a second conductivity type formed above a main surface of the supporting substrate via a buried insulating film; a first base region of a second conductivity type formed from the surface of the second base region; a well region of a first conductivity type formed in the semiconductor layer apart from the first base region in the lateral direction; a buffer region of the first conductivity type adjoining the well region; an emitter region of the first conductivity type formed from the surface of the first base region; a collector region of the second conductivity type formed from the surface of the buffer region; a base contact diffusion region of the second conductivity type formed in the first base region; a gate insulating film formed on the second base region at least from an end of the emitter region to an end of the well region; a gate electrode formed on the gate insulating film; an emitter electrode connected on the emitter region and the base contact diffusion region; and a collector electrode connected on the collector region; wherein the first base region is extended to a part under the gate electrode while having a vertical concentration profile of an impurity of the second conductivity type that increases from the surface of the second base region and becomes maximum under the emitter region; and the length in the lateral direction from a point where the impurity concentration becomes maximum located under an end of the gate electrode to the boundary with the second base region is not smaller than the length in the vertical direction from the point where the impurity concentration becomes maximum to the boundary with the second base region, and the second base region between immediately under the first base region and the buried insulating film has a concentration lower than the surface concentration of the first base region.

A semiconductor device according to another embodiment of the present invention includes a semiconductor substrate having two main surfaces; a semiconductor layer of a first conductivity type adjoining to one of the main surfaces of the semiconductor substrate; a first base region of a second conductivity type formed from the surface of the semiconductor layer; a second base region of the second conductivity type having a concentration lower than the surface concentration of the first base region, and involving the first base region; a base contact diffusion region of the second conductivity type formed from the surface of the first base region or the second base region; an emitter region of the first conductivity type formed from the surface of the first base region; a collector region of the second conductivity type adjoining to the other main surface of the semiconductor substrate; a buffer layer of the first conductivity type inserted between the collector region and the semiconductor layer; a gate insulating film formed at least from an end of the emitter region to an end of the second base region; a gate electrode formed on the gate insulating film; an emitter electrode connected on the emitter region and the base contact diffusion region; and a collector electrode connected on the collector region; wherein the first base region is extended to a part under the gate electrode while having a vertical concentration profile of an impurity of the second conductivity type that increases from the surface of the semiconductor layer and becomes maximum under the emitter region; and the length in the lateral direction from a point where the impurity concentration becomes maximum located under an end of the gate electrode to the boundary with the second base region is not smaller than the length in the vertical direction from the point where the impurity concentration becomes maximum to the boundary with the second base region.

Furthermore, the base contact diffusion region of the second conductivity type is extended to under the emitter region.

Furthermore, a method of the manufacture of a semiconductor device according to the present invention includes the steps of forming a first base region of a second conductivity type on the surface of a semiconductor layer; forming a second base region having a lower concentration and a larger diffusion depth than the first base region so as to include the first base region fully or partly; forming a buffer region of the second conductivity type in the semiconductor layer apart from the second base region; sequentially forming a gate insulating film and a gate electrode on the first base region and the second base region; forming an emitter region of a first conductivity type on the surface of the first base region; and forming a collector region of the first conductivity type on the surface of the buffer layer; wherein the first base region is formed before the step of forming the gate insulating film using the implantation of boron ions with accelerating energy within a range between 150 KeV and 200 KeV, and a dose within a range between $3\times10^{13}$ and $1\times10^{14}$ ions/cm$^2$.

Furthermore, the first base region and the gate electrode are disposed so that the end portions thereof overlap each other.

BRIEF DESCRIPTION OF THE DRAWINGS

FIG. 8A is a sectional view of a method of the manufacture of the lateral IGBT, which is the first embodiment of the present invention;

FIG. 8B is a sectional view of a method of the manufacture of the lateral IGBT, which is the first embodiment of the present invention;

FIG. 8C is a sectional view of a method of the manufacture of the lateral IGBT, which is the first embodiment of the present invention;

FIG. 8D is a sectional view of a method of the manufacture of the lateral IGBT, which is the first embodiment of the present invention;

DESCRIPTION OF THE EMBODIMENTS

Figure 1:
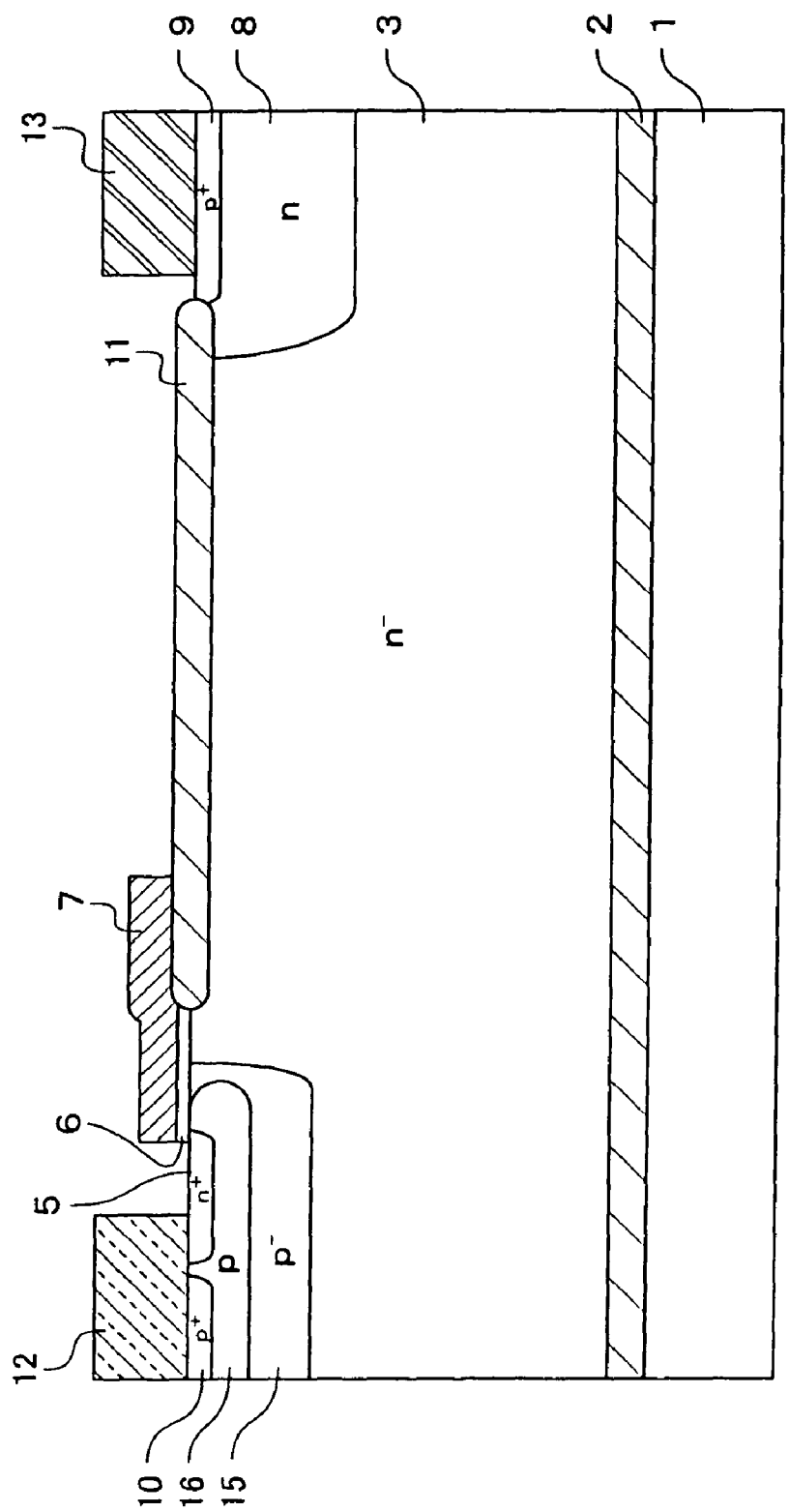
FIG. 1 is a sectional view of a lateral IGBT, which is a first embodiment of the present invention.

The first base region of an insulated gate bipolar transistor (IGBT) of the present invention has the following three characteristics:

First, the first base region has a retrograde profile having the maximum (peak) of the concentration of an impurity of a second conductivity type under the emitter region of a first conductivity type, and the impurity concentration is gradually increased from the surface toward the peak.

Thereby, since the resistance of the base region of the second conductivity type under the emitter region of the first conductivity type can be lowered, the effect of suppressing the turn-on of the parasitic NPN transistor can be obtained.

Second, the first base region slightly extends from under the end of the gate electrode toward the collector region of the second conductivity type. The length in the lateral direction from the maximum point of impurity concentration under the end of the gate electrode is not smaller than the vertical length from the maximum point. Thereby, the quantity of the impurity in the base region of the second conductivity type under the gate electrode can be not less than the quantity of the impurity under the emitter region of the first conductivity type, and the current gain of the parasitic bipolar transistor can be reduced.

Third, the first base region is adjacent to or included in the region of the second conductivity type of a low impurity concentration. The P-type region of a low impurity concentration is equivalent to the second base region or a semiconductor layer.

Thereby, the off-state breakdown voltage can be increased. The first base region is formed near the surface, and the diffusion depth is not significantly large. Therefore, when the first base region is adjacent to the semiconductor layer of the first conductivity type, due to its curvature, increasing electric field lowers the off-state breakdown voltage. According to the present invention, by adjoining the first base region with a region of a second conductivity type of a low impurity concentration that has a relatively large diffusion depth, the reduction of electric field could be obtained, then the off-state breakdown voltage is improved.

As described above, according to the present invention, there is provided an excellent device structure that is particularly effective for a lateral IGBT of high breakdown voltage, can lower on-state voltage and improve SOA at the same time, and can improve the current capability.

The present invention also has effects when applied to a vertical IGBT. In the case of a vertical element, although the collector region and the buffer region are formed on the back-face side of a substrate, the method for forming the base region is the same as the method described for the lateral IGBT.

As a feature of the manufacturing method, the first base region and the second base region having a retrograde profile must be formed before forming a polysilicon gate. Thereby, the first base region and the second base region can be formed under the gate electrode. Into the first base region, boron ions are implanted by a relatively high accelerating energy within a range between 150 and 200 KeV. Thereafter, heat treatment called drive-in is performed to form a retrograde profile having a peak at a depth of about 0.5 μm from the surface.

The present invention will be described referring to each embodiment.

(First Embodiment)

Figure 7:
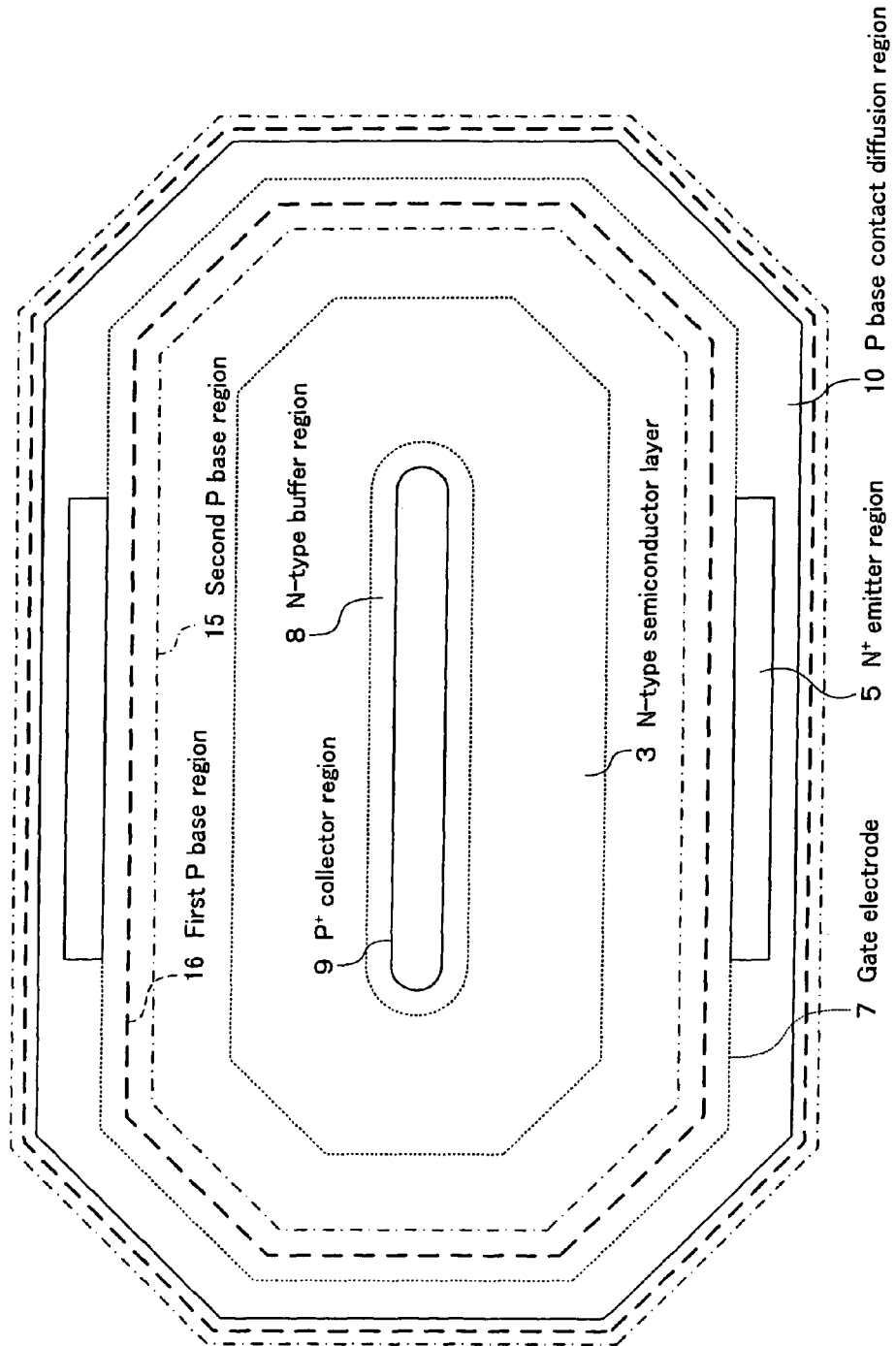
FIG. 7 is a plan view of the lateral IGBT, which is the first embodiment of the present invention.
Figure 9:
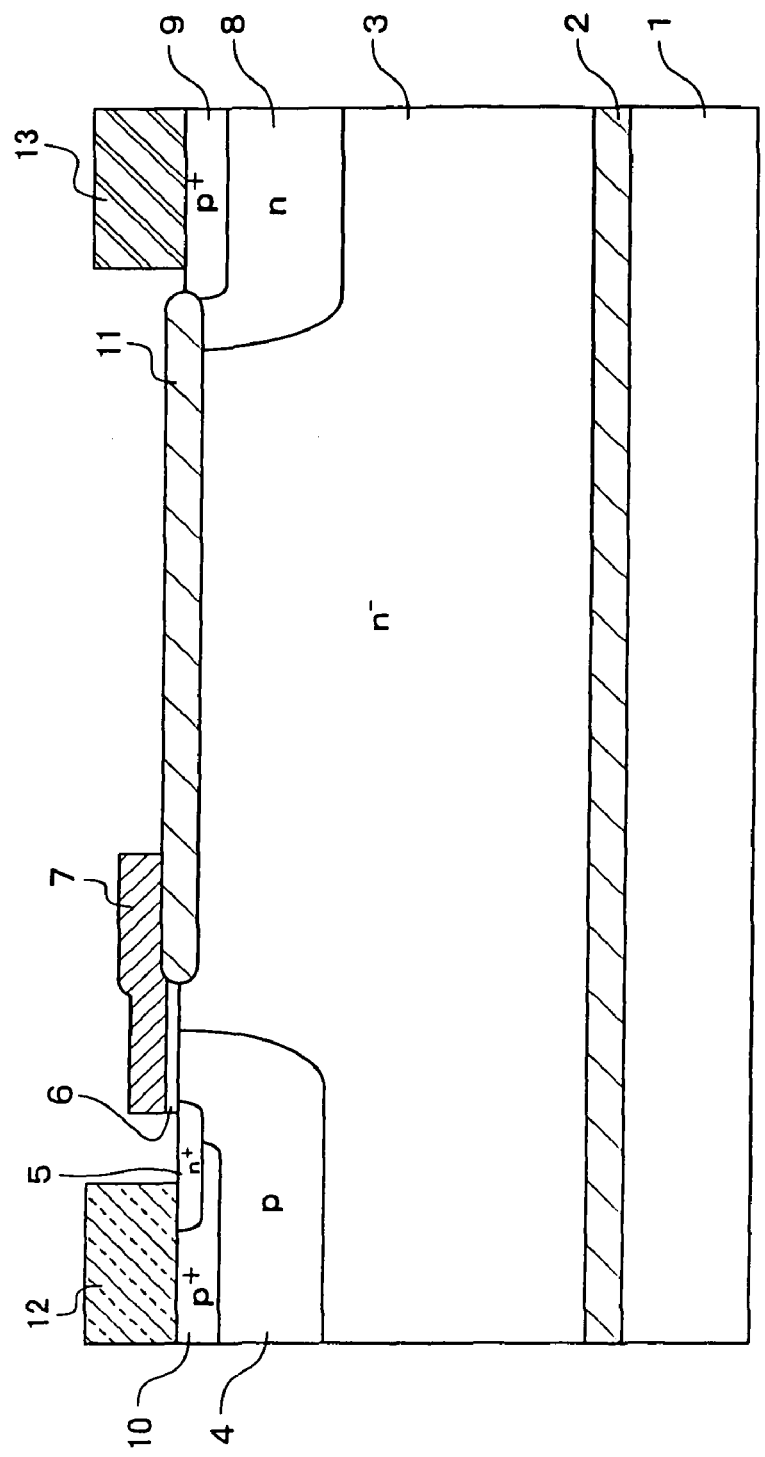
FIG. 9 is a sectional view of a lateral IGBT.
Figure 10:
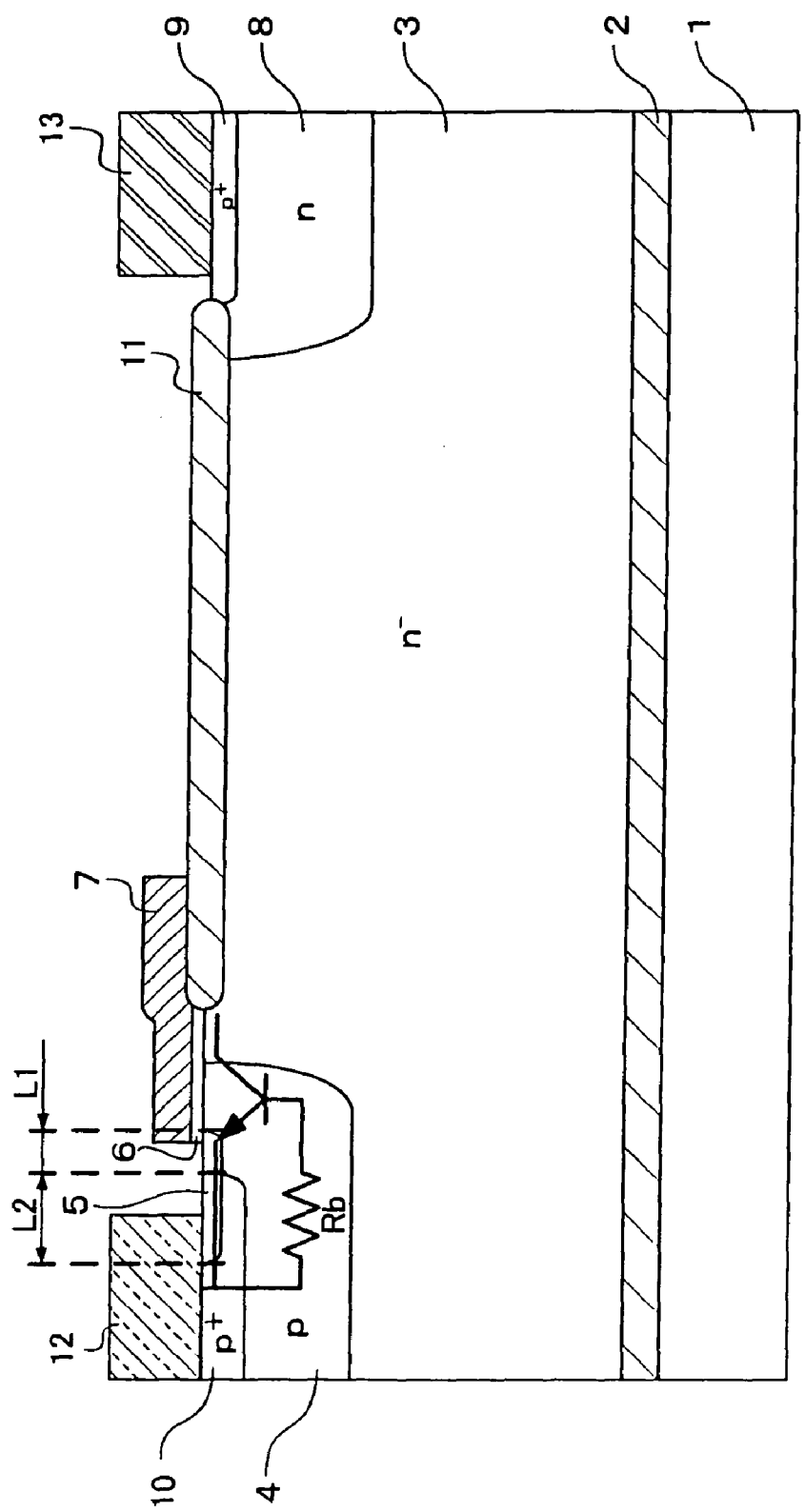
FIG. 10 is a supplemental sectional view of a lateral IGBT.
Figure 11:
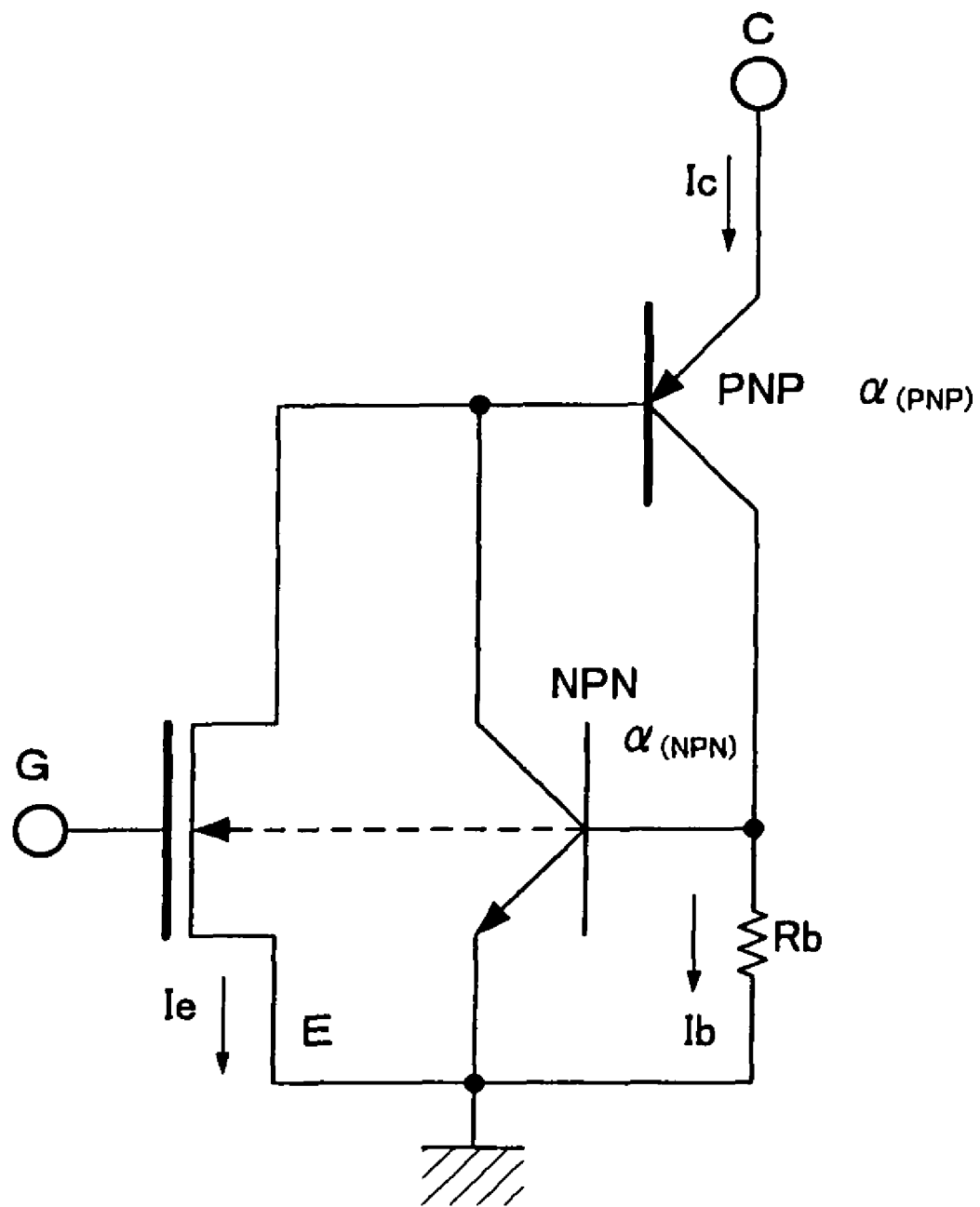
FIG. 11 is an equivalent circuit schematic of a lateral IGBT.
Figure 12:
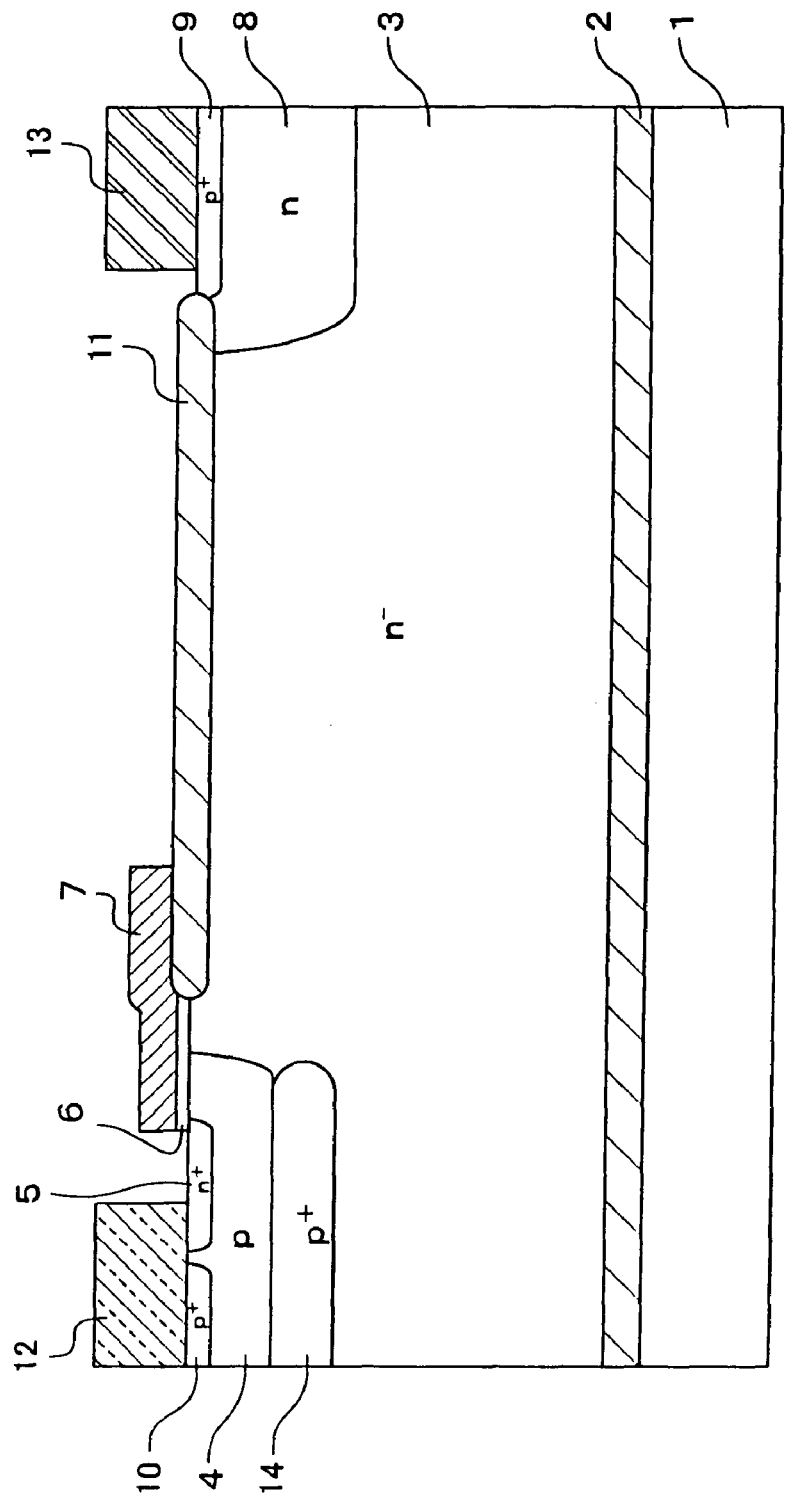
FIG. 12 is a sectional view of a lateral IGBT of a first conventional example.
Figure 13:
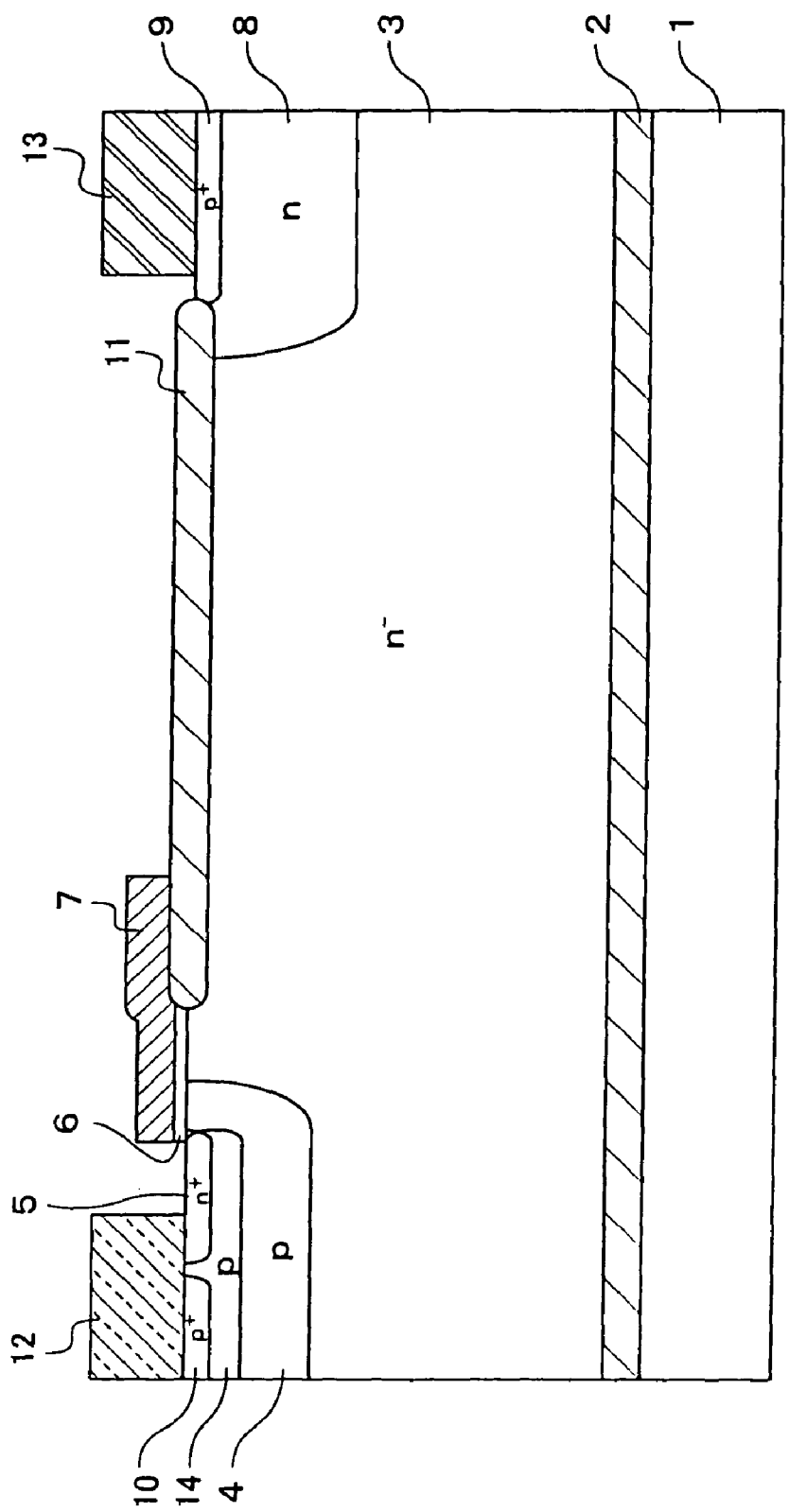
FIG. 13 is a sectional view of a lateral IGBT of a second conventional example.

FIG. 1 shows a sectional view of a lateral IGBT according to the first embodiment of the present invention; and FIG. 7 shows a plan view thereof.

In FIG. 1, on the surface of an N-type semiconductor layer 3 of a low impurity concentration formed on a supporting substrate 1 via a buried insulating film 2, a second P⁻-type base region 15 and an N-type buffer region 8 are diffused apart from each other. The second P⁻-type base region 15 is often shared with a P-type well region of a low voltage NMOS transistor or a P-type offset region of a high voltage PMOS transistor integrated in the same chip, and the surface impurity concentration is as relatively low as about $1 \times 10^{16}$ cm$^{-2}$.

In the second P⁻-type base region 15, a first P-type base region 16 is formed; and further in the first P-type base region 16, an N⁺-type emitter region 5 and a P⁺-type base contact diffusion region 10 are diffused.

A gate electrode 7 is formed above the first P-type base region 16 and the second P⁻-type base region 15 via a gate insulating film 6, and extends above a field oxide film 11. On the N⁺-type emitter region 5 and the P⁺-type base contact diffusion region 10, an emitter electrode 12 is formed. On the N-type buffer region 8, a P⁺-type collector region 9 is formed, and a collector electrode 13 is further formed on the P⁺-type collector region 9. The first P-type base region 16 is formed under the N⁺-type emitter region 5.

Referring to a plan view of FIG. 7, the P⁺-type collector region 9 has a shape having two corner portions and two straight portions; and the P⁺-type collector region 9 is surrounded by an N-type buffer layer 8 and an N-type semiconductor layer 3. The N⁺-type emitter regions 5 are formed on the straight portions, and are not formed on the corner portions. Thereby, current crowding the corner portions is suppressed.

Figure 2:
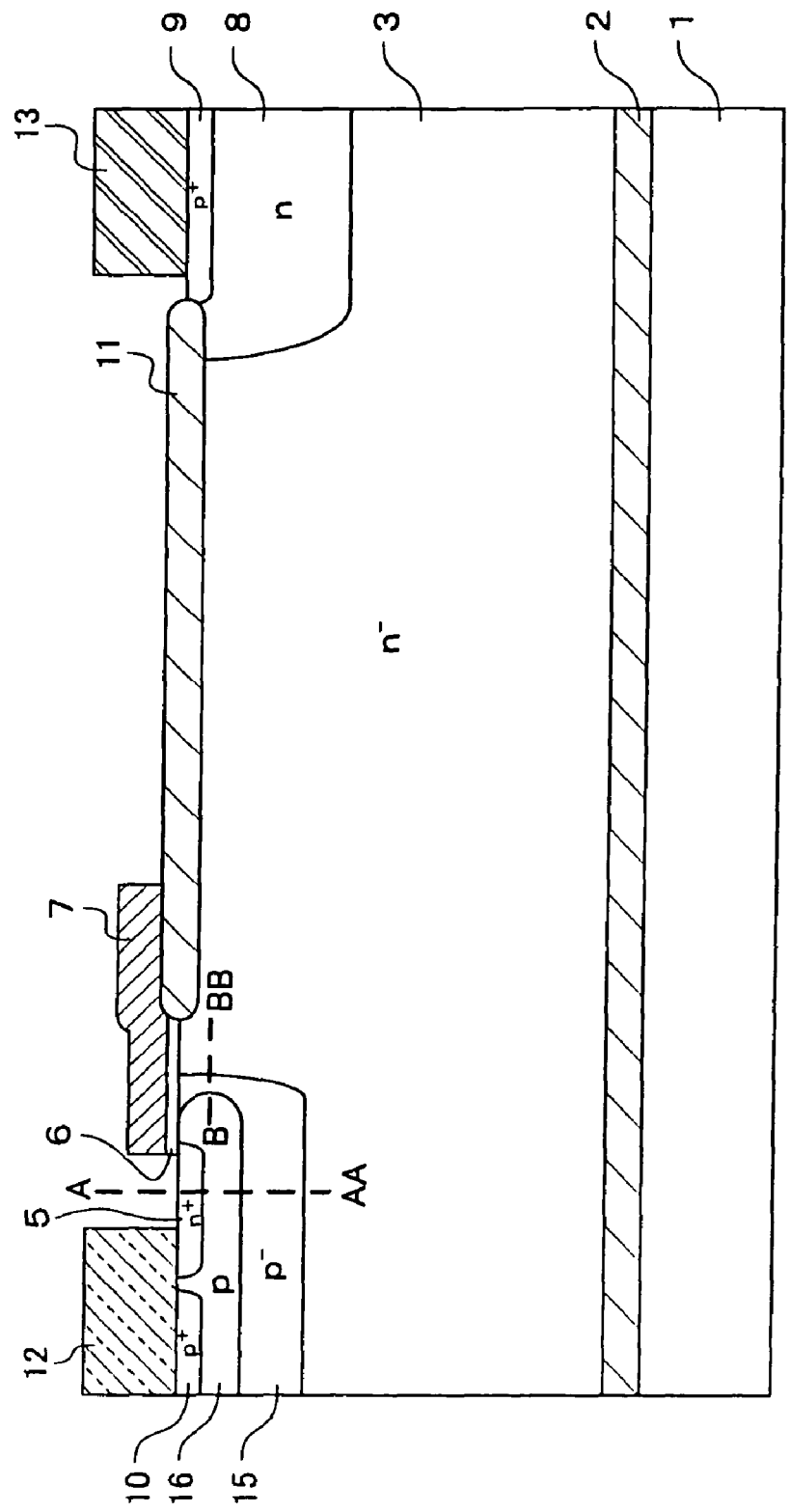
FIG. 2 is a supplemental sectional view of the lateral IGBT, which is the first embodiment of the present invention.
Figure 3:
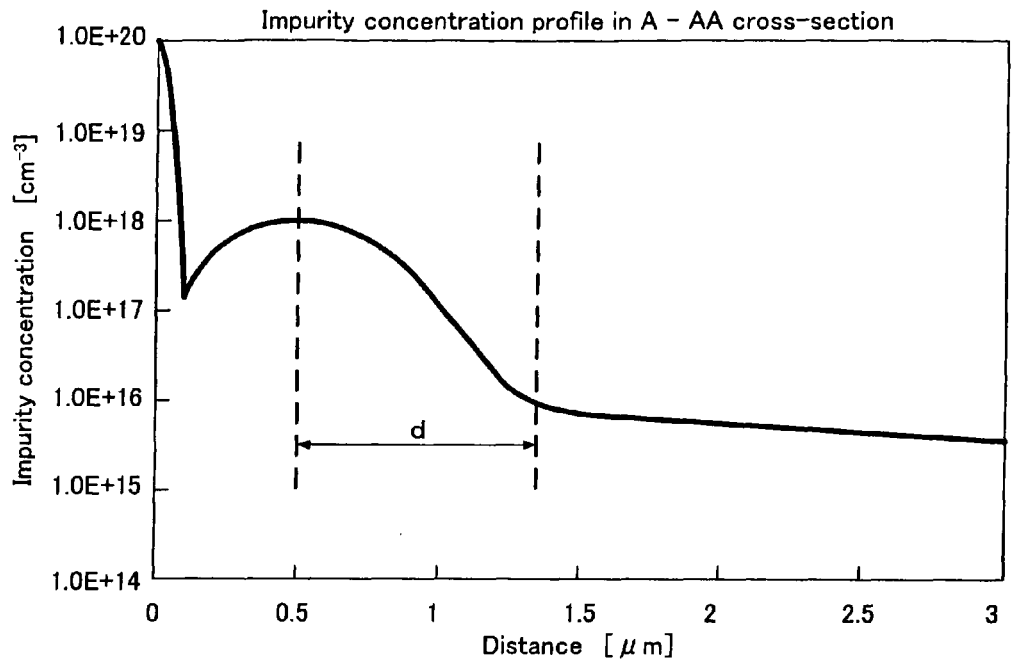
FIG. 3 is a graph showing an impurity concentration profile in A-AA cross-section of the lateral IGBT shown in FIG. 2.
Figure 4:
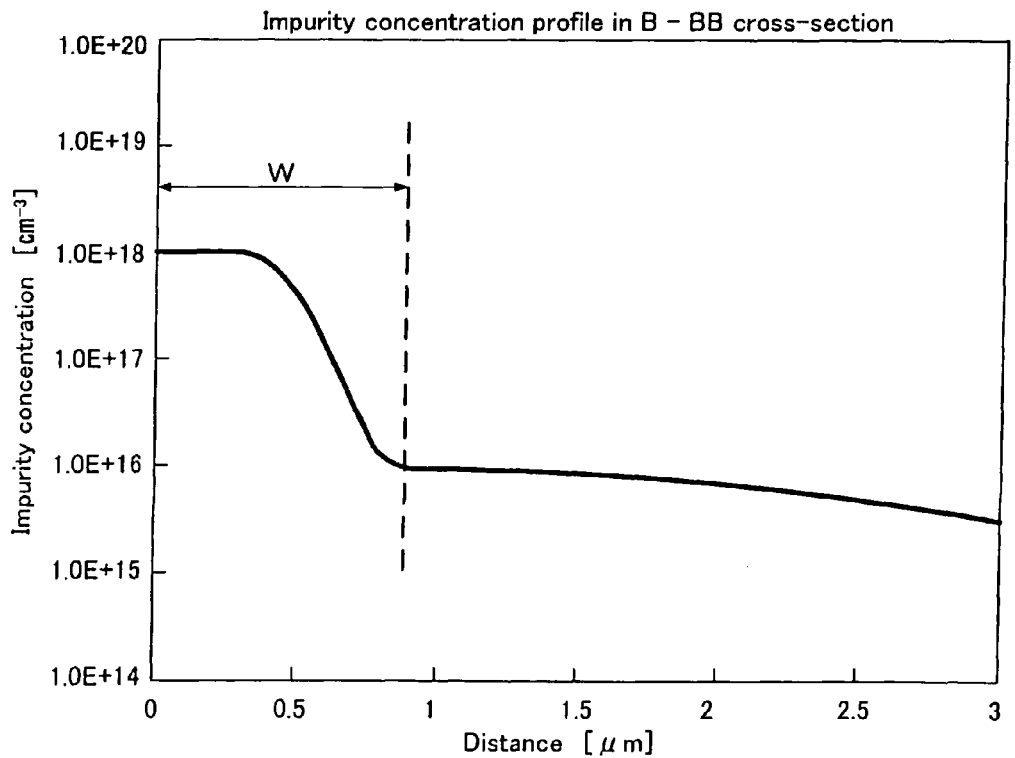
FIG. 4 is a graph showing an impurity concentration profile in B-BB cross-section of the lateral IGBT shown in FIG. 2.

FIG. 2 is a supplemental sectional view; and FIG. 3 is a graph showing an impurity concentration profile in the vertical direction in A-AA cross-section shown in FIG. 2. In FIG. 3, the distance from the maximum point of impurity concentrations to the boundary point with the second base region 15 is represented by "d". FIG. 4 shows an impurity concentration profile in the lateral direction in B-BB cross-section shown in FIG. 2. The B-BB cross-section is a profile from under the gate electrode 7 toward the collector region 9 side in the peak of the A-AA cross-section. The boundary between the first P-type base region 16 and the second P⁻-type base region 15 is the place where the gradient of impurity concentration is changed, and the distance from under the end of the gate electrode 7 is represented by "w".

The PN junction depth of the N⁺-type emitter region 5 and the first P-type base region 16 is about 0.1 μm. The peak of the concentration of the P-type impurity is about $1 \times 10^{18}$ cm$^{-3}$, and is located at a depth of 0.5 μm from the surface and under the N⁺-type emitter region 5. The boundary between the first P-type base region 16 and the second P⁻-type base region 15 is located at about 1.4 μm from the surface where the concentration gradient is changed. The concentration of the P-type impurity lowers relatively slowly, and the surface concentration becomes about $2 \times 10^{17}$ cm$^{-3}$. Such a retrograde doping profile can be easily formed by ion implantation of boron at a dose of $6.5 \times 10^{13}$ ions/cm$^2$ and an accelerating energy of about 180 KeV, and appropriate heat treatment of diffusion called drive-in. The surface concentration of the second P⁻-type base region 15 is about $1 \times 10^{16}$ cm$^{-3}$.

The first P-type base region 16 is extended to increase the concentration of the P-type impurity in the second P⁻-type base region 15 under the gate electrode 7 located in the lateral direction from the end of an emitter region 5.

This is because if the quantity of the impurity in the lateral direction from the end of an emitter region 5 is almost the same as the quantity under the emitter region 5, current gain in the lateral direction lowers, and increase in the current gain in the entire parasitic NPN transistor is suppressed.

Figure 14:
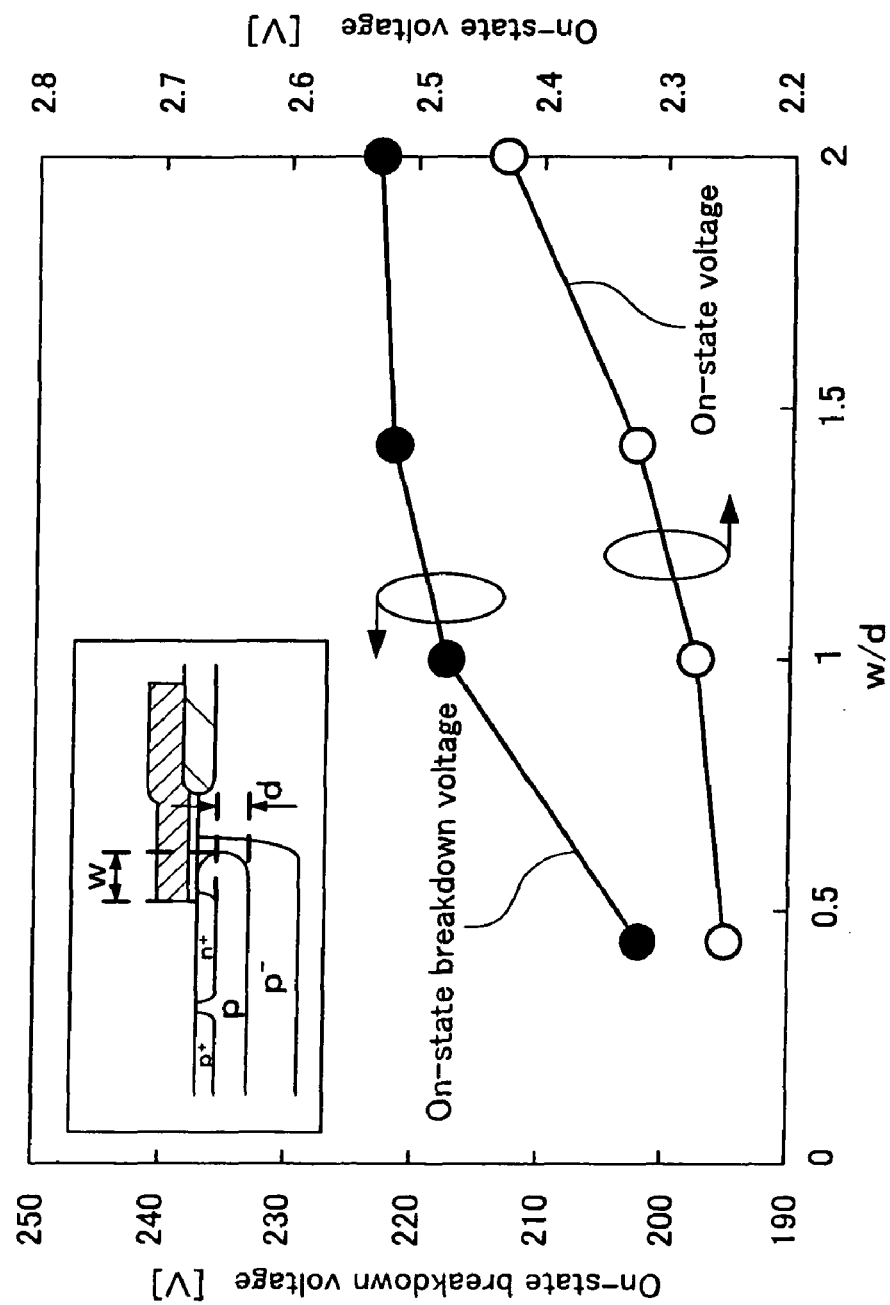
FIG. 14 is a graph showing the relationship between on-state breakdown voltage and dimensional ratio (w/d) of a lateral IGBT of the present invention.

FIG. 14 shows the relationship between on-state breakdown voltage, on-state voltage and "w/d". We consider on-state breakdown voltage rather than current. On the other hand, "w/d" on the abscissa is set because it could indirectly show the ratio of the quantities of the impurity in the vertical direction and the lateral direction.

If "w/d" is smaller than 1, the on-state breakdown voltage sharply lowers. Especially for on-state breakdown voltage of more than 200 V with sufficient margin, "w/d≧1" is required.

When a high concentration P-type region is formed by self-aligning to the thick polysilicon gate electrode as in the conventional techniques, since the P-type diffusion region is laterally spread below the gate electrode, but the lateral spread of diffusion is normally shorter than the depth of diffusion, "w/d" is steadily smaller than 1. Although on-state voltage lowers as "w/d" is smaller, slight saturation is found when "w/d<1".

Therefore, even if "w/d" is at least 1, since on-state breakdown voltage is sharply lowered, the instability is caused. Since on-state voltage is increased when "w/d" is excessively large, it is preferable to set within the range of "1≦w/d≦2".

In the present invention, since the P-type diffusion region is formed before the polysilicon gate electrode, the P-type diffusion region can be extended in an optimal length under the gate electrode, and "1≦w/d≦2" can be easily realized. Considering the on-state voltage and SOA in the present invention, the values of d and w are substantially equal at 0.9 μm, and are set as "d/w=1".

In the first embodiment, although the first P-type base region 16 is formed under the base contact diffusion region 10, and the second P⁻-type base region 15 is formed under the first P-type base region 16, the first P-type base region 16 may be not formed under the base contact diffusion region 10, if the base contact diffusion region 10 is formed from the surface of the second P⁻-type base region 15.

(Second Embodiment)

Figure 5:
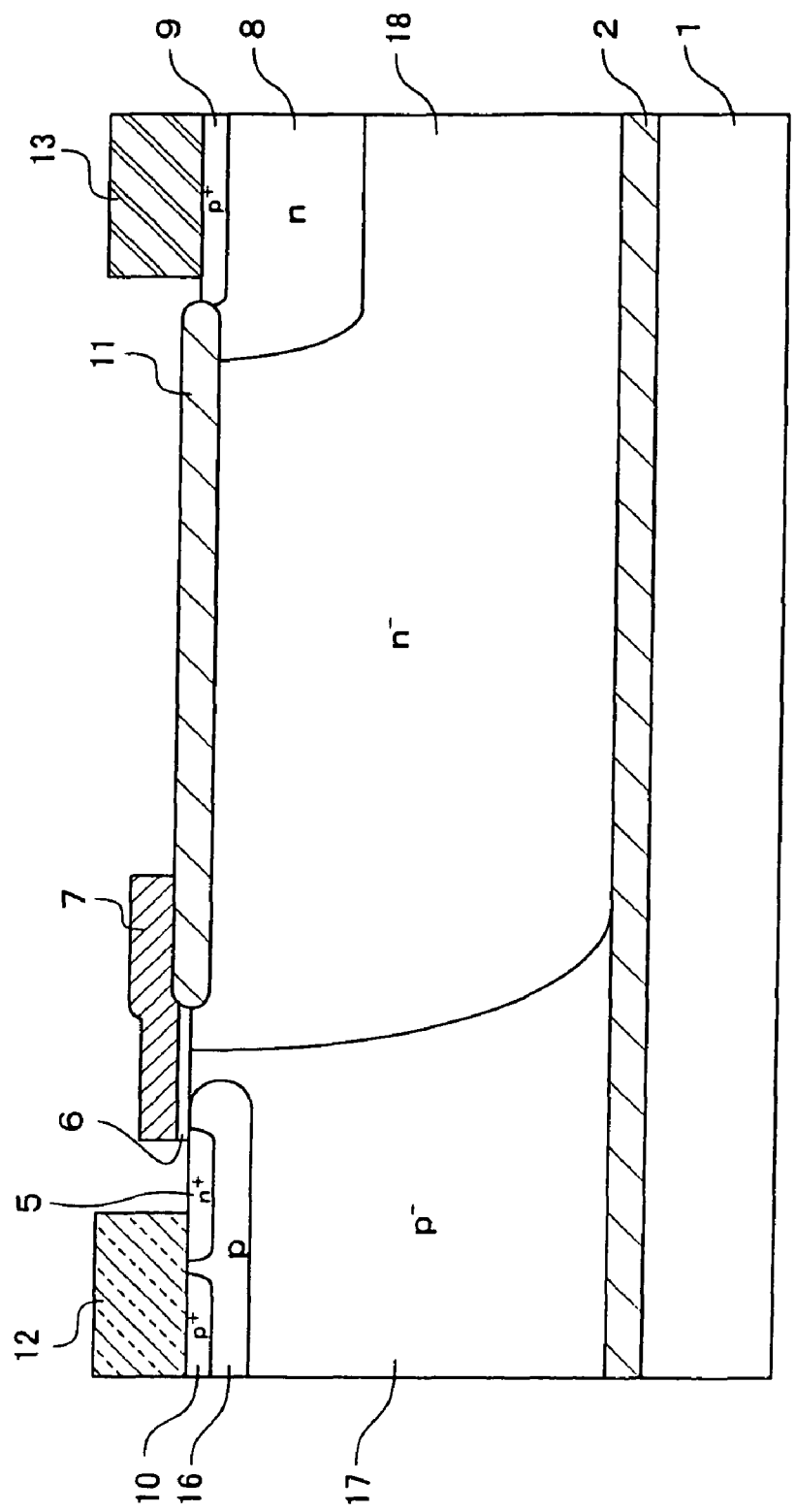
FIG. 5 is a sectional view of a lateral IGBT, which is a second embodiment of the present invention.

FIG. 5 shows a lateral IGBT according to the second embodiment of the present invention, wherein only the following aspects are different from the first embodiment.

The lateral IGBT shown in FIG. 5 has a device structure using an SOI substrate on which a P-type semiconductor layer 17 is formed, and the P-type semiconductor layer 17 reaches a buried insulating film 2. Into a first P-type base region 16 as a first base region, an N⁺-type emitter region 5 and a P⁺-type base contact diffusion region 10 are diffused.

In the same manner as in the first embodiment, the first P-type base region 16 is extended to a part under a gate electrode 7 while having a vertical concentration profile of a P-type impurity that increases from the surface of the P-type semiconductor layer 17 and becomes highest under the N⁺-type emitter region 5. The lateral length w from the maximum point of the impurity concentration located under an end portion of the gate electrode 7 is not smaller than vertical length d from the above-described maximum point, and the P-type semiconductor layer 17 from immediately under the first P-type base region 16 to the buried insulating film 2 has a concentration at least ten times lower than the surface concentration of the first P-type base region 4.

The impurity concentration of the P-type semiconductor layer 17 is $3 \times 10^{+15}$ cm$^{-3}$, and is suppressed to at least ten times lower than the surface concentration of the first P-type base region 16 of $2 \times 10^{+17}$ cm$^{-3}$. Thereby, when a reverse bias is supplied to the N-type well region 18 and the P-type semiconductor layer 17, a depletion region can be extended to the P-type semiconductor layer 17, and the electric field at the end of the first P-type base region 16 could be reduced.

(Third Embodiment)

Figure 6:
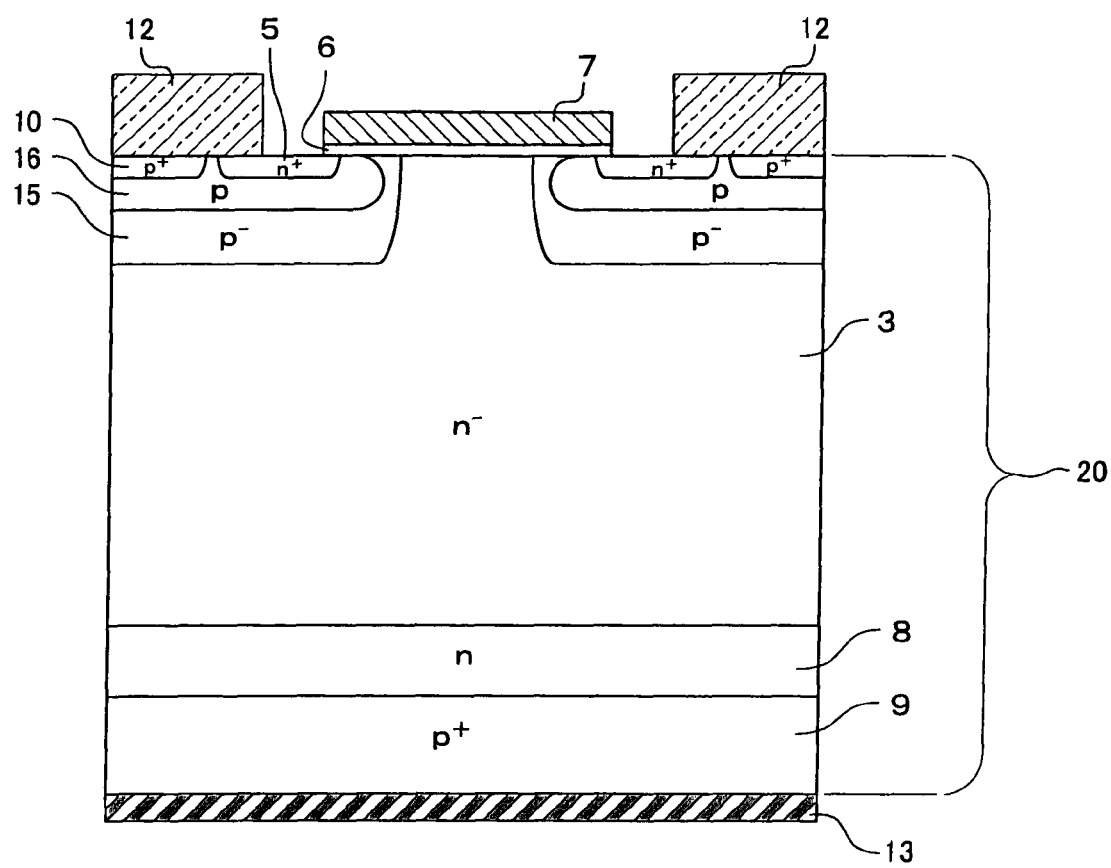
FIG. 6 is a sectional view of a vertical IGBT, which is a third embodiment of the present invention.

FIG. 6 shows a sectional view of a vertical IGBT according to the third embodiment of the present invention.

Because of a vertical element, a P-type collector region 9 is formed on the back face of a substrate 20, and an N-type buffer region 8 is formed on the P-type collector region 9. An N-type semiconductor layer 3 is formed thereon. Second P⁻-type base regions 15 are spaced between each other near the surface, and on the surface of the second P⁻-type base region 15, a first P-type base region 16 is formed.

Furthermore, an N⁺-type emitter region 5 and a P⁺-type base contact diffusion region 10 are formed on the surface of the first P-type base region 16, and an emitter electrode 12 is formed thereon. A gate electrode 7 is formed from an end of the N⁺-type emitter region 5 via the gate insulating film 6. The first P-type base region 16 has a retrograde profile having the peak under the N⁺-type emitter region 5, and is extended under the gate electrode.

In the same manner as in the first embodiment, the first P-type base region 16 is extended to a part under the gate electrode 7 while having a vertical concentration profile of a P-type impurity that increases from the surface of the N-type semiconductor layer 3 and becomes highest under the emitter region 5. The lateral length w from the maximum point of the impurity concentration located under an end portion of the gate electrode 7 is not smaller than the vertical length d from the above-described maximum point.

In the third embodiment, although the first P-type base region 16 is formed under the base contact diffusion region 10, and the second P⁻-type base region 15 is formed under the first P-type base region 16, a configuration wherein the first P-type base region 16 is not formed under the base contact diffusion region 10, can also be formed, and in this case, the base contact diffusion region 10 is formed from the surface of the second P⁻-type base region 15 as the second base region.

(Fourth Embodiment)

FIG. 8 shows a method of the manufacture of an IGBT according to the first embodiment of the present invention.

As shown in FIG. 8A, a second P⁻-type base region 15 and an N-type buffer region 8 are formed on the surface of an N-type semiconductor layer 3 using ion implantation and heat treatment called drive-in. Thereafter, as shown in FIG. 8B, a LOCOS film 11 is formed, and a first P-type base region 16 is formed on the surface of the second P⁻-type base region 15 using boron ion implantation. The accelerating energy is, for example, 180 KeV, and the dose is $6.5 \times 10^{13}$ ions/cm². As shown in FIG. 8C, after forming a gate insulating film 6, a gate electrode 7 of polysilicon is formed so that the end portion thereof overlaps the first P-type base region 16.

As shown in FIG. 8D, an N⁺-type emitter region 5, a P⁺-type collector region 9, and a P⁺-type base contact diffusion region 10 are formed by ion implantation. Furthermore, an emitter electrode 12 and a collector electrode 13 are formed.

In the fourth embodiment, the P⁺-type base contact diffusion region 10 may be extended to under the emitter region 5 to further lower the resistance of the base region. Thereby, the turn-on of the parasitic NPN transistor can be further suppressed.

The first P-type base region 16 can be formed before the formation of the gate insulating film 6 by implanting boron ions using accelerating energy within a range between 150 KeV and 200 KeV and a dose within a range between $3 \times 10^{13}$ and $1 \times 10^{14}$ ions/cm².

In the above-described embodiments, although the case wherein the first conductivity type is N-type and the second conductivity type is P-type is described as an example, the first conductivity type can also be P-type, and the second conductivity type can also be N-type.

What is claimed is:

1. A semiconductor device comprising:
   a supporting substrate;
   a semiconductor layer of a first conductivity type above a main surface of said supporting substrate;
   a first base region of a second conductivity type in a surface of said semiconductor layer;
   a buffer region of the first conductivity type spaced apart from said first base region in a lateral direction;
   an emitter region of the first conductivity type in a surface of said first base region;
   a collector region of the second conductivity type in a surface of said buffer region;
   a base contact diffusion region of the second conductivity type in the surface of said first base region;
   a gate insulating film on said semiconductor layer; and
   a gate electrode on said gate insulating film;
   wherein said first base region under said emitter region and at an end of said gate electrode has a point where an impurity concentration of the second conductivity type becomes maximum, and a length in a lateral direction from said point to an end of said first base region is not smaller than a length in the vertical direction from said point to an underside portion of said base region.

2. The semiconductor device according to claim 1, wherein said emitter region is spaced apart from said collector region and paralell to said collector region.

3. The semiconductor device according to claim 1, further comprising:
   a second base region of the second conductivity type under said first base region and having a concentration lower than the surface concentration of said first base region.

4. The semiconductor device according to claim 1, further comprising:
   an emitter electrode connected to said emitter region and said base contact diffusion region; and
   a collector electrode connected to said collector region.

5. The semiconductor device according to claim 1, wherein said semiconductor layer is on an insulating film which is on said suporting substrate.

* * * * *